(12) United States Patent  
Nagano

(10) Patent No.: US 9,564,565 B2
(45) Date of Patent: Feb. 7, 2017

(54) LIGHT EMITTING DEVICE, LIGHT EMITTING MODULE, AND METHOD FOR MANUFACTURING LIGHT EMITTING DEVICE

(71) Applicant: NICHIA CORPORATION, Anan-shi (JP)

(72) Inventor: Hiroto Nagano, Anan (JP)

(73) Assignee: NICHIA CORPORATION, Anan-shi (JP)

( * ) Notice: Subject to any disclaimer, the term of this patent is extended or adjusted under 35 U.S.C. 154(b) by 0 days.

(21) Appl. No.: 14/868,403

(22) Filed: Sep. 29, 2015

(65) Prior Publication Data

US 2016/0091180 A1   Mar. 31, 2016

(30) Foreign Application Priority Data

Sep. 29, 2014   (JP) ................. 2014-198639

(51) Int. Cl.
| | | |
|---|---|---|
| *F21V 7/04* | (2006.01) | |
| *H01L 33/62* | (2010.01) | |
| *H01L 33/48* | (2010.01) | |
| *H05K 3/12* | (2006.01) | |
| *H05K 3/34* | (2006.01) | |

(52) U.S. Cl.
CPC ............. *H01L 33/62* (2013.01); *H01L 33/486* (2013.01); *H05K 3/1216* (2013.01); *H05K 3/3442* (2013.01); *H05K 3/3484* (2013.01); *H05K 2201/10106* (2013.01); *H05K 2201/10636* (2013.01)

(58) Field of Classification Search
CPC ........ H01L 33/00; H01L 33/486; H01L 33/62; H05K 2201/10106; H05K 3/3442; H05K 3/3484; F21Y 2115/10
See application file for complete search history.

(56) References Cited

U.S. PATENT DOCUMENTS

| | | | |
|---|---|---|---|
| 2006/0022320 A1 | 2/2006 | Nakanishi et al. | |
| 2006/0071330 A1 | 4/2006 | Suminoe et al. | |
| 2009/0045513 A1 | 2/2009 | Kim et al. | |

(Continued)

FOREIGN PATENT DOCUMENTS

| | | |
|---|---|---|
| JP | 2006-041401 | 2/2006 |
| JP | 2006-108284 | 4/2006 |

(Continued)

*Primary Examiner* — Peggy Neils
(74) *Attorney, Agent, or Firm* — Mori & Ward, LLP

(57) ABSTRACT

A light emitting device includes a light emitting element, a first terminal, a second terminal, and a light reflecting member. The first terminal and the second terminal each have a substantially spherical shape and are electrically connected to the light emitting element. The light reflecting member holds the light emitting element, the first terminal, and the second terminal. The light reflecting member includes a bottom surface, an upper surface, a first side surface, a second side surface, a front surface, a back surface, a first terminal exposure surface, and a second terminal exposure surface. The light emitting device is to be placed via the bottom surface. The first terminal is exposed from the first terminal exposure surface to provide a first exposed portion. The second terminal is exposed from the second terminal exposure surface to provide a second exposed portion.

9 Claims, 9 Drawing Sheets

(56) References Cited

U.S. PATENT DOCUMENTS

| | | | |
|---|---|---|---|
| 2009/0115891 A1* | 5/2009 | Ryu | H04N 5/2253 |
| | | | 348/374 |
| 2009/0166862 A1 | 7/2009 | Kweon et al. | |
| 2013/0069102 A1 | 3/2013 | Kimura et al. | |
| 2016/0053968 A1* | 2/2016 | Nagano | H01L 33/62 |
| | | | 362/293 |

FOREIGN PATENT DOCUMENTS

| | | |
|---|---|---|
| JP | 2008-078165 | 4/2008 |
| JP | 2008-181932 | 8/2008 |
| JP | 2008-258080 | 10/2008 |
| JP | 2009-049410 | 3/2009 |
| JP | 2009-158908 | 7/2009 |
| JP | 2010-183122 | 8/2010 |
| JP | 2011-129643 | 6/2011 |
| JP | 2013-069815 | 4/2013 |
| JP | 2013-115336 | 6/2013 |

* cited by examiner

LIGHT EMITTING DEVICE, LIGHT EMITTING MODULE, AND METHOD FOR MANUFACTURING LIGHT EMITTING DEVICE

CROSS-REFERENCE TO RELATED APPLICATIONS

The present application claims priority under 35 U. S. C. §119 to Japanese Patent Application No. 2014-198639, filed Sep. 29, 2014. The contents of this application are incorporated herein by reference in their entirety.

BACKGROUND

Technical Field

The present disclosure relates to a light emitting device, a light emitting module, and a method for manufacturing a light emitting device.

Discussion of the Background

A light emitting diode (LED) has many features of low power consumption, long lifetime, high reliability, and the like, so that as an LED light emitting device which emits white light by combining a blue LED and a phosphor is put to practical use, the LED is widely used for various purposes in various kinds of lights, a light source for backlight, and the like.

Japanese Unexamined Patent Application Publication No. 2013-69815 discloses a chip size package (CSP) type light emitting device. In the CSP type light emitting device, an LED chip is directly covered with a light reflective resin or the like, so that a small and thin light emitting device can be formed. The light emitting device described in Japanese Unexamined Patent Application Publication No. 2013-69815 is a side-surface light emission type semiconductor light emitting device including a semiconductor layer having a light emitting layer, an electrode and a wiring portion connected to the semiconductor layer, and a sealing portion covering the wiring portion. In this semiconductor light emitting device, the positive and negative wiring portions are exposed from a plurality of surfaces of the sealing portion, as terminal surfaces. According to this configuration, since a large terminal surface can be ensured, the semiconductor light emitting device can be small in size and great in mountability to a mounting substrate.

SUMMARY OF THE INVENTION

According to one aspect of the present invention, a light emitting device includes a light emitting element, a first terminal, a second terminal, and a light reflecting member. The light emitting element has a light emitting surface to emit a light. The first terminal and the second terminal each have a substantially spherical shape and are electrically connected to the light emitting element. The light reflecting member holds the light emitting element, the first terminal, and the second terminal. The light reflecting member includes a bottom surface, an upper surface, a first side surface, a second side surface, a front surface, a back surface, a first terminal exposure surface, and a second terminal exposure surface. The light emitting device is to be placed via the bottom surface. The upper surface is opposite to the bottom surface in a height direction of the light emitting device. The first side surface is provided between the bottom surface and the upper surface on a first side in a width direction of the light emitting device perpendicular to the height direction. The second side surface is provided between the bottom surface and the upper surface on a second side opposite to the first side in the width direction. The front surface is provided between the bottom surface and the upper surface and between the first side surface and the second side surface on a front side in a depth direction of the light emitting device perpendicular to the height direction and the width direction. The light emitting surface of the light emitting element is exposed from the front surface. The back surface is provided between the bottom surface and the upper surface and between the first side surface and the second side surface on a back side opposite to the front side in the depth direction. The first terminal is exposed from the first terminal exposure surface to provide a first exposed portion. The second terminal is exposed from the second terminal exposure surface to provide a second exposed portion. The first and the second exposed portions are provided inside a bottom region defined by the first side surface, the second side surface, the front surface, and the back surface of the light reflecting member when viewed from a bottom surface side of the light reflecting member in the height direction, are provided inside a side region defined by the upper surface, the bottom surface, the front surface, and the back surface of the light reflecting member when viewed from the first side or the second side of the light reflecting member in the width direction, and are provided inside a back region defined by the first side surface, the second side surface, the upper surface, and the bottom surface of the light reflecting member when viewed from the back side of the light reflecting member in the depth direction.

According to another aspect of the present invention, a light emitting module includes the light emitting device. The light emitting device is mounted on a mounting substrate.

According to further aspect of the present invention, a method for manufacturing a light emitting device includes connecting a first terminal and a second terminal to a light emitting element having a light emitting surface to emit a light. The first terminal and the second terminal each have a substantially spherical shape. A light reflecting member is provided to hold the light emitting element, the first terminal, and the second terminal and to include a bottom surface via which the light emitting device is to be placed, an upper surface opposite to the bottom surface in a height direction of the light emitting device, a first side surface provided between the bottom surface and the upper surface on a first side in a width direction of the light emitting device perpendicular to the height direction, a second side surface provided between the bottom surface and the upper surface on a second side opposite to the first side in the width direction, a front surface from which the light emitting surface of the light emitting element is exposed and which is provided between the bottom surface and the upper surface and between the first side surface and the second side surface on a front side in a depth direction of the light emitting device perpendicular to the height direction and the width direction, and a back surface provided between the bottom surface and the upper surface and between the first side surface and the second side surface on a back side opposite to the front side in the depth direction. The light reflecting member is partially removed so that a first terminal exposure surface is provided and the first terminal is partially exposed from the first terminal exposure surface to provide a first exposed portion, so that a second terminal exposure surface is provided and the second terminal is partially exposed from the second terminal exposure surface to provide a second exposed portion, and so that the first and the second exposed portions are provided inside a bottom region defined by the first side surface, the second side surface, the front surface, and the back surface of the light reflecting member when viewed from a bottom surface side of the light reflecting member in the height direction, are provided inside a side region defined by the upper surface, the bottom surface, the front surface, and the back surface of the light reflecting member when viewed from the first side or the second side of the light reflecting member in the width direction, and are provided inside a back region defined by the first side surface, the second side surface, the upper surface, and the bottom surface of the light reflecting member when viewed from the back side of the light reflecting member in the depth direction.

BRIEF DESCRIPTION OF THE DRAWINGS

A more complete appreciation of the invention and many of the attendant advantages thereof will be readily obtained as the same becomes better understood by reference to the following detailed description when considered in connection with the accompanying drawings, wherein.

DESCRIPTION OF THE EMBODIMENTS

Figure 1:
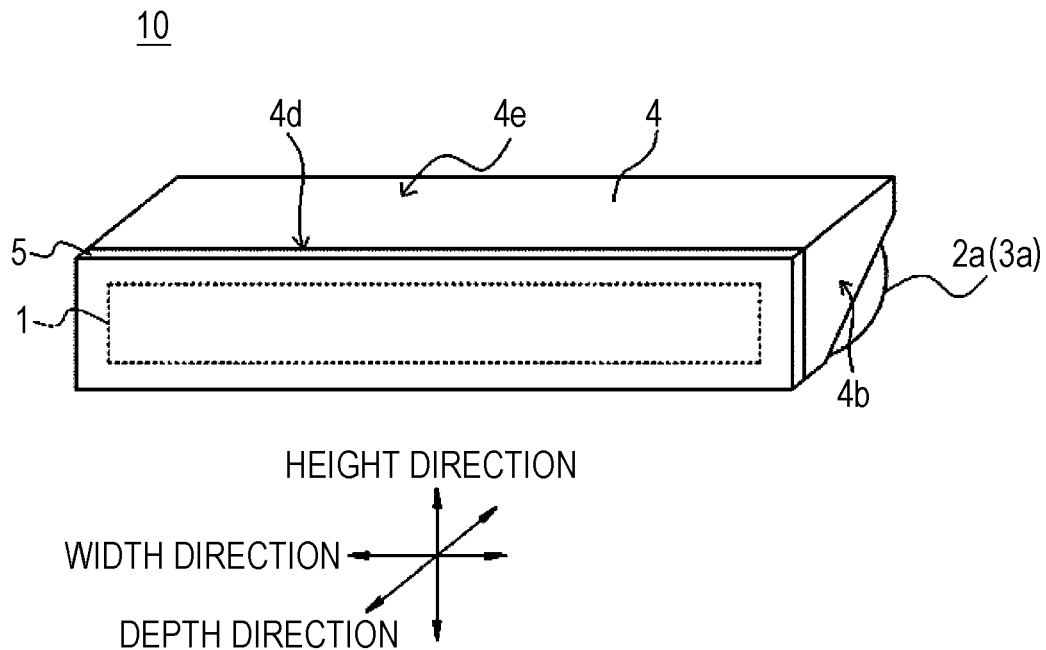
FIG. 1 is a schematic perspective view of a light emitting device 10 according to a first embodiment viewed from a front surface side.

The embodiments will now be described with reference to the accompanying drawings, wherein like reference numerals designate corresponding or identical elements throughout the various drawings.

Hereinafter, embodiments will be described with reference to the drawings. However, a light emitting device which will be described below is only provided to embody a technical idea of the present disclosure, and the present invention is not limited to the following light emitting device. Specifically, dimensions, materials, shapes, relative arrangement of the components which will be described below do not limit a technical range of the present invention unless otherwise described, and they are only examples for the description. In addition, sizes and positional relation of the members shown in each drawing are sometimes exaggerated to make clear the description. Furthermore, as for each component in the embodiments, a plurality of components may be composed of one member so that one member serves as a plurality of components, or conversely, function of one member may be realized by a plurality of members. In addition, each configuration can be appropriately combined to be applied in the embodiments described below also unless otherwise specified.

First Embodiment

Figure 2:
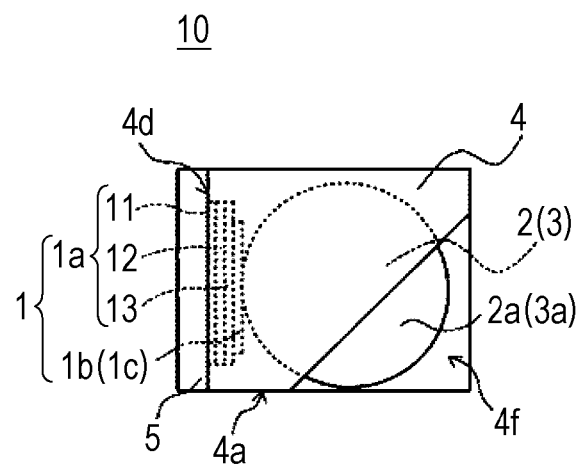
FIG. 2 is a schematic view of the light emitting device 10 according to the first embodiment viewed from a side surface side.
Figure 3A:
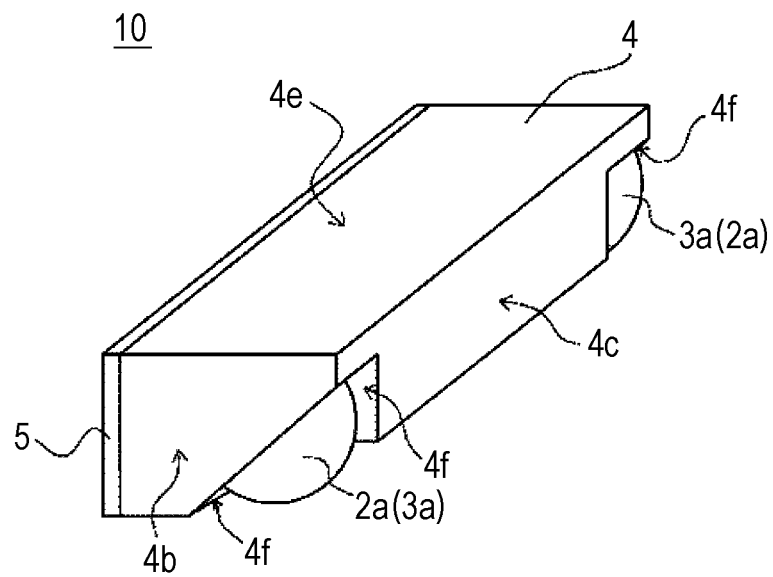
FIG. 3A is a schematic perspective view of the light emitting device 10 according to the first embodiment viewed from a back surface side.

FIG. 1 is a schematic perspective view of a light emitting device 10 according to a first embodiment viewed from a front surface side. FIG. 2 is a schematic view of the light emitting device 10 viewed from a side surface side. FIG. 3A is a schematic perspective view of the light emitting device 10 viewed from a back surface side. The light emitting device 10 according to the first embodiment is suited for being used mainly as a side-surface light emission type light emitting device. The light emitting device 10 includes a light emitting element 1, a first terminal 2 and a second terminal 3 electrically connected to the light emitting element 1, and a light reflecting member 4 holding the above components. The light emitting element 1 may include a semiconductor layer $1a$, an n-side electrode $1b$, and a p-side electrode $1c$. A light emitting surface of the light emitting element 1 (surface opposite to an electrode formation surface of the semiconductor layer $1a$) is exposed from the light reflecting member 4. The first terminal 2 and the second terminal 3 each has a substantially spherical shape, and are electrically connected to the n-side electrode $1b$ or the p-side electrode $1c$ of the light emitting element 1 respectively. The first terminal 2 and the second terminal 3 are partially exposed from the light reflecting member 4 as exposed portions 2a and 3a, respectively.

In the first embodiment, the light reflecting member 4 forms external surfaces of the light emitting device 10. The light reflecting member 4 may include a bottom surface 4a serving as a mounting surface of the light emitting device 10, side surfaces 4b, a back surface 4c, a front surface 4d, and an upper surface 4e. According to the first embodiment, the side surfaces 4b each abuts on the bottom surface 4a substantially vertically. In addition, the side surfaces 4b are arranged substantially parallel to each other, and the bottom surface 4a and the upper surface 4e are arranged substantially parallel to each other. The front surface 4d of the light reflecting member 4 covers the electrode formation surface side of the light emitting element 1. The back surface 4c of the light reflecting member 4 is the surface opposite to the front surface 4d that serves as the light emitting surface of the light emitting device 10, where the light emitting element 1 is exposed. In addition, in the description below, it is assumed that a substantially perpendicular direction from the front surface 4d to the back surface 4c is referred to as a "depth direction", a direction substantially perpendicular from the bottom surface 4a to the upper surface 4e is referred to as a "height direction", and a direction substantially perpendicular to the side surfaces 4b is referred to as a "width direction".

The light reflecting member 4 further includes terminal exposure surfaces 4f in addition to the surfaces described above. The exposed portions 2a and 3a are exposed from the terminal exposure surfaces 4f respectively.

The exposed portions 2a and 3a are formed at an inner side with respect to an outermost surface of the light reflecting member 4, seen from the bottom surface side, either of the side surfaces side, and the back surface side of the light reflecting member 4. In the specification, the term an "outermost surface" refers to a surface with an outermost periphery when viewed from the bottom surface side, the side surface side, and the back surface side of the light reflecting member 4 (as to what surface is the outermost surface when viewed from each surface side, will be described below), respectively. In addition, the term "inner side" refers to a state within the periphery of the outermost surface, but the exposed portions 2a and 3a may substantially align with the periphery of the outermost surface or may be partially outside of the outermost surface.

In the configuration described above, the first terminal 2 and the second terminal 3 in a spherical shape which are provided in advance are used, so that compared with a case where the terminals of a desired thickness are formed by plating or the like, a processing cost and a time can be reduced. Furthermore, with the use of spherical first terminal 2 and second terminal 3, the exposed portions 2a and 3a having an outwardly round surface can be respectively exposed from the terminal exposure surfaces 4f provided by partially removing the light reflecting member 4, so that a large surface area can be obtained. In addition, each of the outwardly rounded exposed portions 2a and 3a is positioned at an inner side with respect to the outermost surface when viewed from each surface side of the light reflecting member 4, so that a reduction in the connection strength between the light emitting device 10 and a mounting substrate 20 can be avoided. In addition, absorption of light by the bonding agent 6 that connects the light emitting device 10 and the mounting substrate 20 can be suppressed by the terminal exposure surfaces 4f. Therefore, while the light extraction can be sufficiently maintained, the light emitting device can be high in connection strength and mounting applicability to the mounting substrate 20.

Hereinafter, each component of the light emitting device 10 according to the first embodiment will be described in detail. In addition, a configuration of each component which will be described below is shown as an example, and the present invention is not limited to that configuration.

Light Emitting Device 10
Light Emitting Element 1

The light emitting element 1 may include the semiconductor layer 1a having an n-type semiconductor layer 11, an active layer 12, and a p-type semiconductor layer 13, the n-side electrode 1b formed on the n-type semiconductor layer 11, and the p-side electrode 1c formed on the p-type semiconductor layer 13. In the first embodiment, the n-type semiconductor layer 11, the active layer 12, and the p-type semiconductor layer 13 of the semiconductor layer 1a are formed in this order in the depth direction. For example, the semiconductor layer 1a can be made of ZnSe, a nitride semiconductor ($In_XAl_YGa_{1-X-Y}N$ ($0 \leq X$, $0 \leq Y$, $X+Y \leq 1$)), GaAlAs, AlInGaP or the like. Each semiconductor layer may have a single-layer structure or may have a stacked-layer structure composed of layers having different compositions and/or different thicknesses, or a super lattice structure. The active layer 12 preferably has a single quantum well structure or multiple quantum well structure. The light emitting element 1 may have a substrate in addition to the semiconductor layer 1a. In order to efficiently extract the light from the light emitting element 1, a substrate made of a component having high light transmissivity such as sapphire can be used. In the case of the light emitting device in which the semiconductor layer 1a is formed on the substrate, the semiconductor layer 1a can be exposed from the light reflecting member 4 by removing the substrate. Thus, the light extraction from the light emitting element 1 can be improved. The substrate can be easily removed by using a laser lift-off (LLO) method.

The n-side electrode 1b can be formed, for example, by using a RIE method using a resist, on a portion which has been exposed in the n-type semiconductor layer 11 by partially removing the active layer 12 and the p-type semiconductor layer 13 in the semiconductor layer 1a. Meanwhile, the p-side electrode 1c is formed on the p-type semiconductor layer 13. Each electrode may be made of a material such as Au, Ag, an Ag alloy, Al, an Al alloy, or ITO. Each electrode may be formed by using a sputtering method, a vapor deposition method, or the like. The upper surfaces of the n-side electrode 1b and the p-side electrode 1c preferably have substantially the same height, so that the first terminal 2 and the second terminal 3 having substantially the same size can be easily connected thereto.

First Terminal 2 and Second Terminal 3

The first terminal 2 and the second terminal 3 each has a substantially spherical shape, and are electrically connected to the n-side electrode 1b or the p-side electrode of the light emitting element 1, respectively. The first terminal 2 and the second terminal 3 each preferably has a substantially spherical shape having a circular cross-sectional surface, but may have a substantially spherical shape having an elliptical cross-sectional surface. In the first embodiment, the first terminal 2 and the second terminal 3 are connected in a row in the width direction of the light emitting element 1. Since each of the first terminal 2 and the second terminal 3 has the spherical shape, each of the exposed portions 2a and 3a has the outwardly round surface as will be described below, so that mounting of the light emitting device having good mounting applicability can be obtained.

As for the first terminal 2 and the second terminal 3 connected to the light emitting element 1, their end portions are preferably arranged on substantially the same plane in the depth direction. In a case where there is a step difference between the n-side electrode 1b and the p-side electrode 1c, the first terminal 2 and the second terminal 3 having different sizes are used so that their end portions can be arranged on substantially the same plane in the depth direction.

Figure 8:
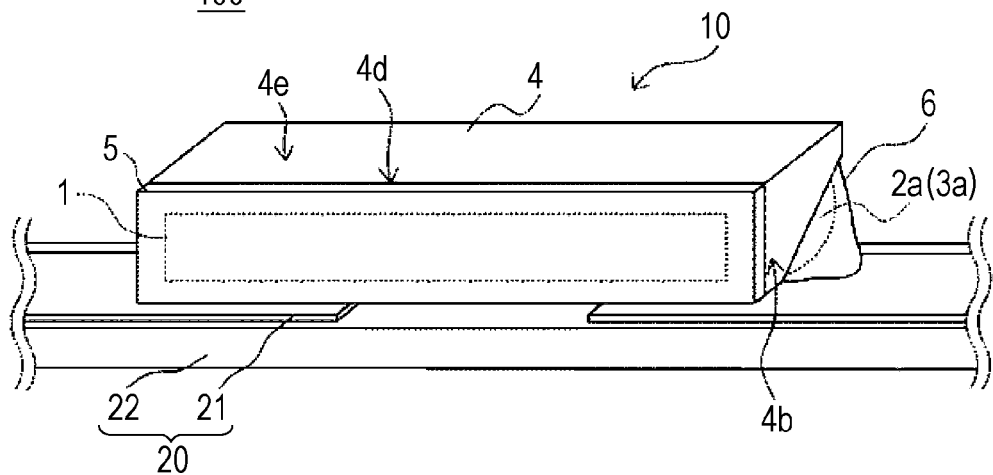
FIG. 8 is a schematic view of a light emitting module 100 in which the light emitting device 10 according to the first embodiment is mounted on a mounting substrate 20.

The substantially spherical first terminal 2 and second terminal 3 are covered with the light reflecting member 4 which will be described below, and they are partially exposed from the terminal exposure surfaces 4f of the light reflecting member 4, as the exposed portions 2a and 3a, respectively. Accordingly, each of the exposed portions 2a and 3a has the outwardly round surface exposed from the terminal exposure surface 4f, and its surface is a covering portion B which will be described below. However, in the case where the first terminal 2 and the second terminal 3 are also partially removed at the time of partially removing the light reflecting member 4, the surface of each of the exposed portions 2a and 3a may be flat or not flat, and the surface may be partially a core A. The exposed portions 2a and 3a each serves as an external terminal to be electrically connected to a wiring 21 of the mounting substrate 20 as shown in FIG. 8.

The exposed portions 2a and 3a can be provided in the end portions in the width direction of the light emitting device 10. With this arrangement, the exposed portions 2a and 3a can be prevented from causing a short circuit. In the case where the first terminal 2 and the second terminal 3 have a diameter of about 40 μm to about 200 μm, the exposed portions 2a and 3a are preferably exposing about 10% to about 80% of their respective terminals. With this arrangement, connection strength with the mounting substrate 20 can be improved.

Figure 4:
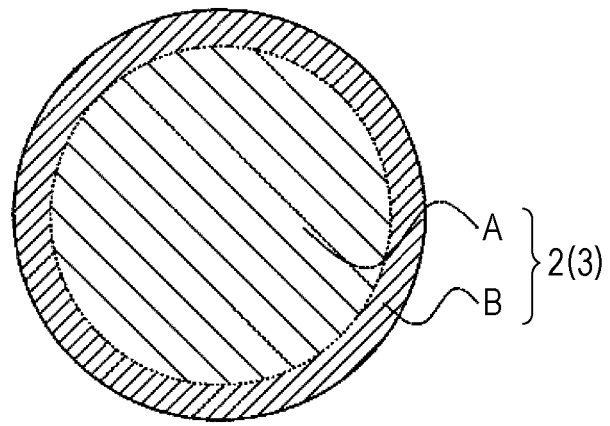
FIG. 4 is a schematic cross-sectional view of a first terminal or a second terminal according to the first embodiment.

FIG. 4 is a schematic cross-sectional view of the first terminal or the second terminal according to the first embodiment. The first terminal 2 and the second terminal 3 are preferably made of an electrically-conductive material which allows for easy bonding to the electrodes of the light emitting element 1 and to the wirings of the mounting substrate 20 by heating or the like, and which allows for maintaining of their predetermined shapes after the heating. For example, as shown in FIG. 4, each may have a configuration composed of the electrically-conductive core A and the electrically-conductive covering portion B which covers the core A.

Hereinafter, a description will be given to the first terminal 2 and second terminal 3 each composed of the electrically-conductive core A and the covering portion B.

The core A is a member to determine the shapes of the first terminal and the second terminal, and preferably made of a material which can maintain the predetermined shape during and after the heating operation. The core A is preferably made of a material containing Cu as its major component (e.g. Cu content is 50% by mass or more). Especially, the core A is preferably made of a material whose Cu content is 99% by mass or more, or Cu alloyed with one or more metals selected from Zn, Sn, P, Ni, Au, Mo, and W, because good thermal and electrical conductivity can be provided. The core A preferably has a substantially spherical shape, so that the first terminal 2 and the second terminal 3 can be easily formed into a substantially spherical shape. The core A preferably has a diameter of about 1 μm to about 1000 μm, and more preferably has a diameter of about 40 μm to about 200 μm.

The covering portion B is preferably made of a solder which can bond the core A to the light emitting element and/or the mounting substrate. More specifically, the covering portion B is preferably made of Au alloyed with at least one of Si, Ge, and Sn. In addition, the covering portion B may be made of Ni, Ni—B, or Ni—P. Especially, the covering portion B which has a Sn-based multilayer structure can be preferably used as a bonding agent to connect the light emitting device to the mounting substrate. The Sn-based covering portion B may have a single-layer structure composed of a Sn-based alloy, or may have a multi-layer structure composed of Sn and another alloy, or of a plurality of Sn alloys.

In the case where the covering portion B is made of Sn, the covering portion B may have a thickness of about 1 μm to about 50 μm, and more preferably about 1 μm to about 10 μm. With the covering portion B of the above thickness, good connection to the electrode of the light emitting element 1 and to the wiring of the mounting substrate 20 can be obtained, and occurrence of short circuit between the first terminal 2 and the second terminal 3 can be prevented.

As described above, in the case where the terminal is composed of the core A and the covering portion B, the material of the core A preferably has a melting temperature higher than that of the covering portion B. For example, as described above, in the case where each of the first terminal 2 and the second terminal 3 includes the core A made of Cu and the covering portion B made of Sn, the light emitting element 1 can be easily bonded to the first terminal 2 and the second terminal 3 by placing the terminals on the electrodes of the light emitting element 1 which are made of a metal and applying heat thereto. Furthermore, in the case of exposing the covering portion B at each of the exposed portions 2a and 3a, the light emitting device 10 can be bonded to the mounting substrate 20 by heating the exposed portions of the covering portion B.

In the above, the description has been given to the first terminal 2 and the second terminal 3 each including the core A and the covering portion B, but the configuration is not limited to this. The light emitting element 1 may be connected to the first terminal 2 and the second terminal 3 by using a method other than the eutectic bonding. For example, they may be connected by Ag paste. Furthermore, a plurality of first terminals 2 and second terminals 3 may be connected to respective electrodes of the light emitting device 1, and/or a plurality of exposed portions 2a or 3a may be formed.

Light Reflecting Member 4

The light reflecting member 4 holds the light emitting element 1, the first terminal 2, and the second terminal 3. More specifically, the light reflecting member covers the electrode formation surface side of the light emitting element 1, and the first terminal 2 and the second terminal 3 except for the exposed portions 2a and 3a. The light reflecting member 4 electrically insulates the first terminal 2 from the second terminal 3, and reflects the light from the semiconductor layer 1a toward the light emitting surface of the light emitting device 10.

As described above, the light reflecting member 4 has the bottom surface 4a (mounting surface), the side surfaces 4b, the back surface 4c, the front surface 4d, and the upper surface 4e. The bottom surface 4a, the side surfaces 4b, and the back surface 4c of the light reflecting member 4 are formed so that the first terminal 2 and the second terminal 3 are respectively within the outer most surfaces of those surfaces. Further, in the first embodiment, the terminal exposure surfaces 4f respectively connected to the bottom surface 4a, the side surface 4b, and the back surface 4c and expose the exposed portions 2a and 3a are provided. In the specification, the expression "connected to the bottom surface, the side surface, and the back surface" means connected to all of the bottom surface, the side surface, and the back surface.

The terminal exposure surfaces 4f are each formed by partially removing the light reflecting member, and may be composed of one or more surfaces. The terminal exposure surfaces 4f in the first embodiment are each formed by removing a portion around a corner of the substantially cuboidal light reflecting member so as to have a recessed shape composed of a plurality of surfaces. With the terminal exposure surfaces 4f having such a recessed shape, a large surface area can be provided for the exposed portions 2a and 3a. In addition, this configuration is also preferable in that an increased amount of the bonding agent to connect the light emitting device 10 and the mounting substrate can be accommodated. In addition, each of the terminal exposure surfaces 4f may be a flat surface or a curved surface.

Figure 5:
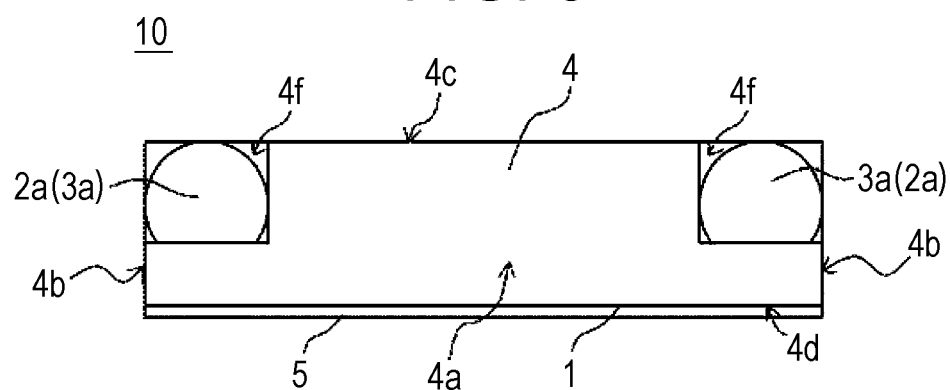
FIG. 5 is a schematic view of the light emitting device 10 according to the first embodiment viewed from a bottom surface side.

The shapes of the surfaces of the light reflecting member 4 other than the terminal exposure surface 4f can be determined according to the shape of the terminal exposure surfaces 4f that have been formed. For example, as shown in FIGS. 3A and 5, each of the bottom surface 4a (mounting surface) and the back surface 4c has a substantially T shape, the side surface 4b has a substantially pentagonal shape, and the upper surface 4e has a substantially rectangular shape. However, the shape of each surface of the light reflecting member 4 is not limited to the above shape.

Figure 6:
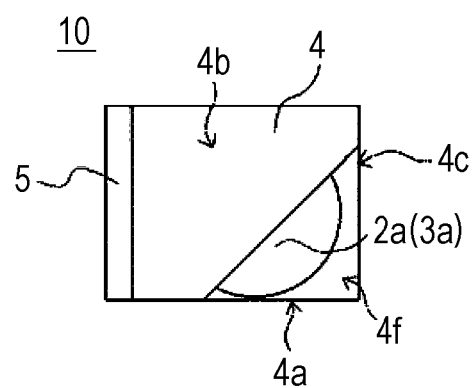
FIG. 6 is a schematic view of the light emitting device 10 according to the first embodiment viewed from the side surface side.
Figure 7:
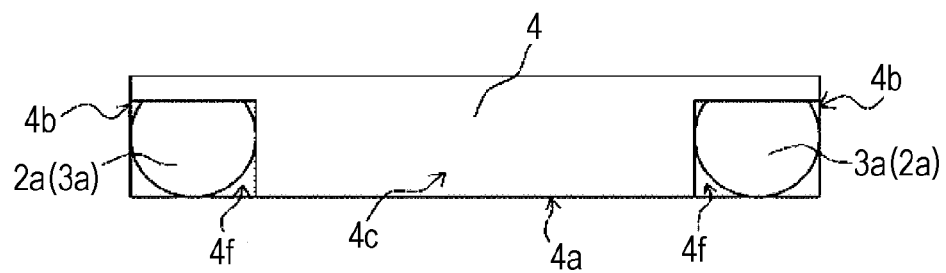
FIG. 7 is a schematic view of the light emitting device 10 according to the first embodiment viewed from the back surface side.

Hereinafter, relationships between the surfaces of the light reflecting member 4 and the exposed portions 2a and 3a will be described with reference to FIGS. 5 to 7. FIG. 5 is a schematic view of the light emitting device 10 viewed from the bottom surface side. FIG. 6 is a schematic view of the light emitting device 10 viewed from the side surface side. FIG. 7 is a schematic view of the light emitting device 10 viewed from the back surface side.

Each of the exposed portions 2a and 3a is formed at an inner side with respect to the outermost surfaces of the light reflecting member 4 when viewed from the bottom surface side, the side surface side, and the back surface side. As shown in FIG. 5, when the light reflecting member 4 is viewed from the bottom surface 4a side, the outermost surfaces of the light reflecting member 4 are the side surfaces 4b and the back surface 4c, and the exposed portions 2a and 3a are respectively at an inner side with respect to the side surfaces 4b and the back surface 4c. Similarly, as shown in FIG. 6, when the light reflecting member 4 is viewed from the side surface 4b side, the outermost surfaces of the light reflecting member 4 are the bottom surface 4a and the back surface 4c, and the exposed portion 2a is at an inner side with respect to the bottom surface 4a and the back surface 4c. Furthermore, as shown in FIG. 7, when the light reflecting member 4 is viewed from the back surface 4c side, the outermost surfaces of the light reflecting member 4 are the bottom surface 4a and the side surfaces 4b, and the exposed portions 2a and 3a are respectively at an inner side with respect to the bottom surface 4a and the side surface 4b. Therefore, the exposed portions 2a and 3a do not project from the outermost surfaces of the light reflecting member 4 when viewed from each surface of the light reflecting member 4. In the case where the bottom surface 4a of the light reflecting member 4 and a portion of the exposed portions 2a and 3a are on substantially the same plane, the light emitting device 10 can be more stably mounted on the mounting substrate 20.

According to the configuration as described above, while a large surface area can be provided for the exposed portions 2a and 3a, the mounting surface (the bottom surface 4a of the light reflecting member 4) of the light emitting device 10 can be stably mounted on the mounting substrate. Also, the providing of the exposed portions 2a and 3a respectively at an inner side with respect to the outermost surfaces of the light reflecting member 4 when viewed from the bottom surface side, the side surface side, and the back surface side of the light reflecting member 4 allows for preventing absorption of the light emitted from the light emitting device 10 by the bonding agent 6 in a light emitting module. Accordingly, the light emitting device 10 that has a high bonding strength with the mounting substrate 20 and allows for stable mounting on the mounting substrate 20, and has good light extraction efficiency can be obtained.

The material of the light reflecting member 4 is not specifically limited as long as the material can electrically insulate the first terminal 2 from the second terminal 3, and can reflect the light emitted from the semiconductor layer 1a toward the light emitting surface of the light emitting device 10. For example, the material in which a light reflecting material is contained in a base material can be employed.

Examples of the base material include ceramic, resin, glass, dielectric material, pulp, and a composite material containing two or more kinds of these. Particularly, it is preferably a resin which can be easily molded into a desired shape. Examples of such a resin include, a silicone resin, a modified silicone resin, an epoxy resin, a modified epoxy resin, a phenol resin, an acrylic resin, an unsaturated polyester resin, a polycarbonate resin, a polynorbornene resin, and a hybrid resin containing two or more kinds of these resins.

Examples of the light reflecting material includes, titanium oxide, zinc oxide, titanium dioxide, silicon dioxide, zirconium dioxide, potassium titanate, alumina, aluminum nitride, boron nitride, mullite, niobium oxide, barium sulfate, carbon black, and various rare-earth oxides (e.g., yttrium oxide, and gadolinium oxide). The base material may also contain a diffusing agent, a coloring agent, and/or a filler for the purpose of enhancing the strength and heat releasing property of the light reflecting member, and adjusting a coefficient of thermal expansion.

A reflectivity of the light reflecting member 4 for the light from the light emitting element 1 is preferably about 60% or greater, and more preferably about 70% to about 90% or greater.

Wavelength Conversion Layer 5

The light emitting surface side of the light emitting element 1 (that is, the semiconductor layer 1a which is exposed from the light reflecting member 4) is preferably covered with the wavelength conversion layer 5. The wavelength conversion layer 5 is, for example, made of a base material which can transmit the light emitted from the light emitting element 1 and contains a wavelength conversion member which can convert a wavelength of the light emitted from the light emitting element 1 into a desirable wavelength. Examples of the base material include a silicone resin, a modified silicone resin, an epoxy resin, a modified epoxy resin, a phenol resin, an acrylic resin, a polycarbonate resin, a polynorbornene resin, or a hybrid resin containing two or more kinds of these resins, and glass. For the wavelength conversion member, an appropriate phosphor can be employed. Also, for the wavelength conversion member, a light emitting material, so-called called nanocrystal or quantum dot may be employed. Further, the wavelength conversion layer 5 may contain a diffusing agent or the like.

Examples of the phosphor include, a nitride-based phosphor and an oxynitride-based phosphor which are activated mainly with a lanthanoid-based element such as europium or cerium. More specific examples include, an α-sialon or β-sialon type phosphor and various kinds of alkali earth metal nitride silicate phosphors activated with europium, an alkali earth metal halogen apatite phosphor, an alkali earth halosilicate phosphor, an alkali earth metal silicate phosphor, an alkali earth metal halogen borate phosphor, an alkali earth metal aluminate phosphor, an alkali earth metal silicate, an alkali earth metal sulfide, an alkali earth metal thiogallate, an alkali earth metal silicon nitride, and a germanate, which are mainly activated with a lanthanoid-based element such as europium and/or a transition metal-based element such as manganese, a rare earth aluminate and a rare earth silicate which are mainly activated with a lanthanoid-based element such as cerium, and an organic substance and an organic complex which are mainly activated with a lanthanoid-based element such as europium. Especially, a YAG-based phosphor which is a yellow phosphor, KSF ($K_2SiF_6$:Mn) which is a red phosphor, and a β-SiAlON phosphor and a LAG-based phosphor which are green phosphors are favorably used. In addition, other than above, a phosphor which exhibits similar performance and effect can be appropriately used. The phosphor may be used alone or two or more kinds may be mixed to be used.

As the quantum dot, more specifically, nano-size high dispersible particles such as CdSe, core-shell type $CdS_xSe_{1-x}$/ZnS, GaP, InP, AgInS, or CuInS may be used.

Mounting Substrate 20

FIG. 8 is a schematic view of a light emitting module 100 in which the light emitting device 10 is mounted on the mounting substrate 20. The mounting substrate 20 is a substrate on which the light emitting device 10 is mounted, and includes the wirings 21 and a base member 22. The wirings 21 are electrically connected to the exposed portions 2a and 3a of the light emitting device 10, respectively. In addition, the mounting substrate 20 may be only composed of the wirings 21.

The wirings 21 can be made of a material having high electroconductivity such as copper, nickel, palladium, tungsten, chrome, titanium, aluminum, silver, gold, or an alloy of them. Particularly, the wirings 21 are preferably made of copper or a copper alloy, in view of a heat releasing property of the heat generated in the light emitting device 10. Also, a film composed of silver, platinum, tin, gold, copper, rhodium, or an alloy of those may be formed on a surface of the wiring made of an appropriate material. Also, a film of silver oxide or silver alloy oxide may be formed on a surface of the wiring by oxidizing the surface of the wiring made of silver or silver alloy.

The base member 22 can be made of an insulating material such as ceramics, a glass epoxy, or a resin. It is particularly preferably made of ceramics having high heat resistance and weather resistance. As the ceramics material, alumina, aluminum nitride, or mullite is preferably, and a low temperature co-fired ceramics (LTCC) may also be used. Other than the above, the base member 22 may be an insulating base member provided by covering a surface of a metal material with an insulating material.

Light Emitting Module 100

Figure 3B:
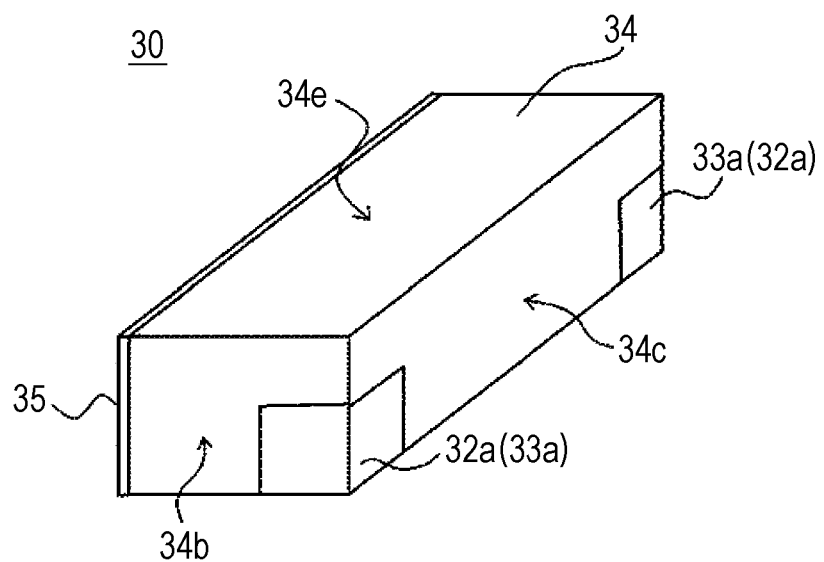
FIG. 3B is a schematic perspective view of a light emitting device 30 in which a light reflecting member and an exposed portion are formed to be substantially flush with each other viewed from a back surface side, as a comparative example of the light emitting device 10.
Figure 13:
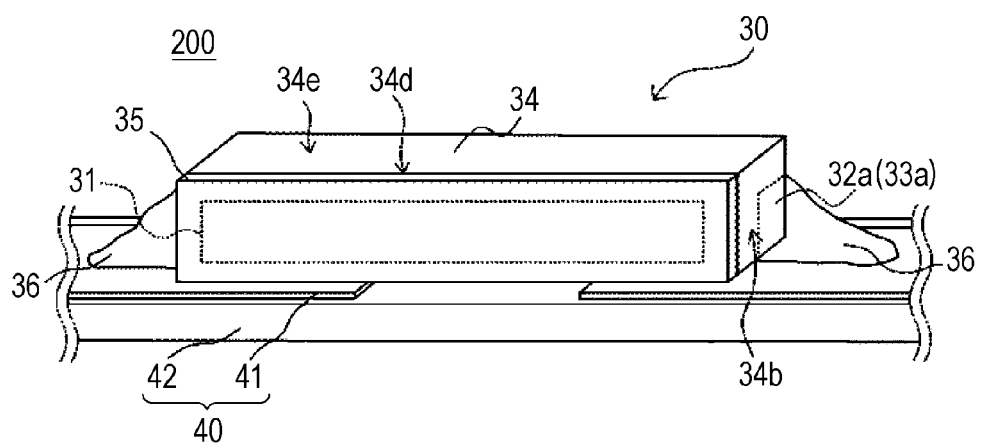
FIG. 13 is a schematic view of a light emitting module 200 in which the light emitting device 30 in the comparative example is mounted on a mounting substrate 40.

The light emitting module 100 is provided such that the light emitting device 10 is mounted on the mounting substrate 20. The mounting surface (i. e., the bottom surface 4a of the light reflecting member 4) of the light emitting device 10 is mounted on the wirings 21 of the mounting substrate 20, and the exposed portions 2a and 3a exposed from the terminal exposure surfaces 4f of the light reflecting member 4 can be respectively electrically connected to the wirings 21 with the bonding agent 6 (made of an electrically-conductive bonding material such as a solder, or an anisotropically-conductive member such as an anisotropic conductive paste (ACP)). In the first embodiment, the bonding agent 6 which rose up along the exposed portions 2a and 3a can be prevented from absorbing the light emitted from the light emitting surface due to the terminal exposure surfaces 4f. Therefore, it is possible to prevent the bonding agent 36 from absorbing the light more than a light emitting device 30 and a light emitting module 200 in which a light reflecting member 34 and exposed portions 32a and 33a are provided on substantially the same plane (or the exposed portions 32a and 33a project outward from the light reflecting member 34), as shown in a comparative example in FIGS. 3B and 13.

Method for Manufacturing Light Emitting Device 10

Figure 9A:
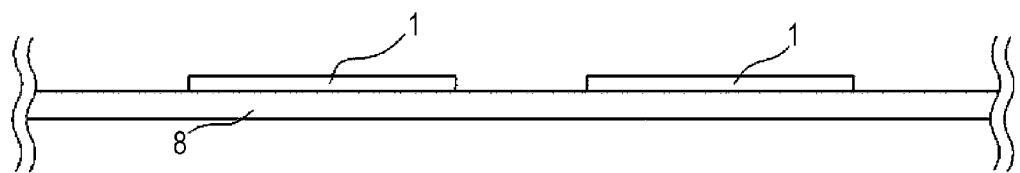
FIG. 9A is a schematic view illustrating a step of connecting terminals in a method for manufacturing the light emitting device 10 according to the first embodiment.
Figure 9B:
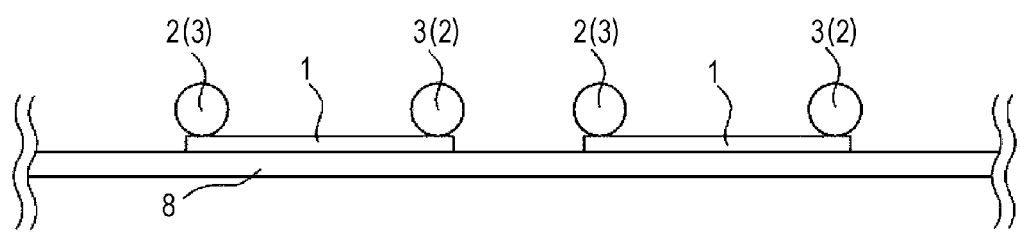
FIG. 9B is a schematic view illustrating the step of connecting the terminals in the method for manufacturing the light emitting device 10 according to the first embodiment.
Figure 10A:
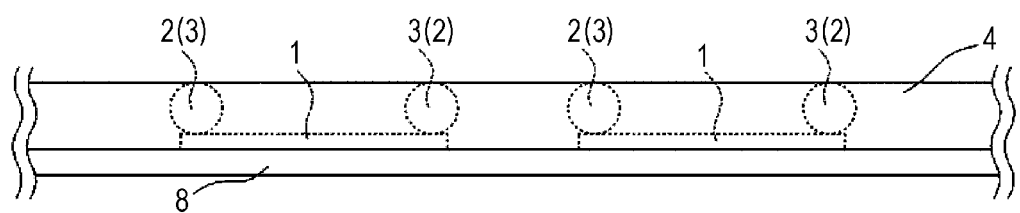
FIG. 10A is a schematic view illustrating a step of providing a light reflecting member in the method for manufacturing the light emitting device 10 according to the first embodiment.
Figure 10B:
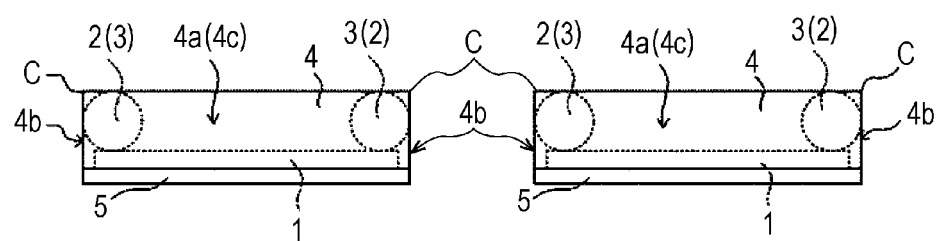
FIG. 10B is a schematic view illustrating the step of providing the light reflecting member in the method for manufacturing the light emitting device 10 according to the first embodiment.
Figure 11:
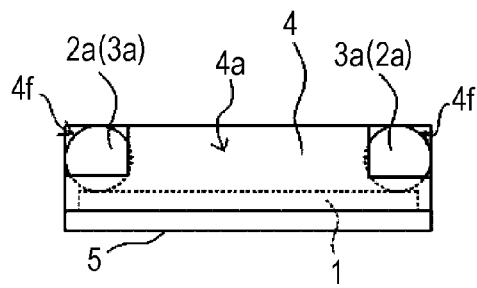
FIG. 11 is a schematic view illustrating a step of partially removing the light reflecting member in the method for manufacturing the light emitting device 10 according to the first embodiment.

Hereinafter, a method for manufacturing the light emitting device 10 according to the first embodiment will be described with reference to FIGS. 9A to 11. FIGS. 9A and 9B are schematic views showing the step of connecting the terminals in the method for manufacturing the light emitting device 10. FIGS. 10A and 10B are schematic views showing the step of providing the light reflecting member. FIG. 11 is a schematic view showing the step of partially removing the light reflecting member. In addition, the following description illustrates an example, so that another method and step order may be appropriately used.

Connecting Terminals

In the step of connecting the terminals, the substantially spherical first terminal 2 and second terminal 3 are respectively connected to the light emitting element 1. First, a plurality of light emitting elements 1 each including the semiconductor layer, the n-side electrode, and the p-side electrode are provided, and disposed on a sheet 8. For example, the sheet 8 may include a base member made of a polyimide and a bonding layer made of an acrylic-based resin disposed on the base member, and the light emitting elements 1 are disposed on the upper surface of the sheet 8 at intervals of about 0.4 mm to about 2.3 mm. Subsequently, a flux is appropriately applied on the n-side electrode and the p-side electrode of the light emitting element 1. The method of applying the flux can be appropriately selected from printing, transfer printing, and the like.

Subsequently, the first terminal 2 and the second terminal 3 are set on the respective electrodes of the light emitting element 1. According to the first embodiment, each of the first terminal 2 and the second terminal 3 having a diameter of about 110 μm is provided by previously covering the Cu core A of about 100 μm in diameter with the covering portion B made of Sn of about 5 μm in thickness, and then, with the use of a suction jig, place the first terminal 2 and the second terminal 3 on the electrodes of the light emitting element 1 respectively. At this time, a temporary fixing material may be used. As the temporary fixing material, an appropriate known material may be used. In addition, the first terminal 2 and the second terminal 3 can be disposed with high accuracy by previously forming a holding portion having a recess corresponding to the shape of the terminal, in each electrode of the light emitting element 1 (or forming the electrode itself into a recessed shape corresponding to the shape of the terminal).

Then, the light emitting elements 1 each having the first terminal 2 and the second terminal 3 are heated together with the sheet 8 in an oven or on a heating plate at about 280° C. or more for about one minute or more. Accordingly, the covering portion B made of Sn is melted and cured, and the light emitting element 1 and the electrically-conductive core A are bonded, so that the first terminal 2 and the second terminal 3 are fixed to the light emitting element 1. Alternatively, the light emitting element 1 may be connected to the first terminal 2 and the second terminal 3 with a different solder, an Ag paste, or the like.

Providing Light Reflecting Member

Subsequently, in the step of providing the light reflecting member, the light reflecting member 4 is formed to hold the light emitting element 1, the first terminal 2, and the second terminal 3. According to the first embodiment, the sheet 8 having the light emitting elements 1 connected to the first terminals 2 and the second terminals 3 (hereinafter, these are collectively referred to as a sheet aggregate 80) is set in a mold 90, and a silicone resin containing a light reflecting material such as titanium oxide is filled in the mold 90 and cured to form the light reflecting member 4. In addition, the light reflecting member 4 may be formed by a desired method such as injection molding, extrusion molding, transfer molding, printing, or coating.

Subsequently, the sheet 8 is removed from the sheet aggregate 80 after the light reflecting member 4 has been formed, and the wavelength conversion layer 5 is appropriately formed so as to cover the light emitting surface of the light emitting element 1. Thus, the wavelength of the light from the light emitting element 1 can be converted to a wavelength of light having a desired color. The wavelength conversion layer 5 can be formed, for example, by applying a silicone resin which contains a phosphor by using a desired method such as spraying, coating, or printing. The wavelength conversion layer 5 may have a thickness of about 30 µm to about 300 µm.

Subsequently, the light reflecting member 4 is singulated. Each of the singulated light reflecting members 4 at least has the bottom surface 4a which is to serve as the mounting surface of the light emitting device 10, the side surfaces 4b, and the back surface 4c. According to the first embodiment, the singulated light reflecting member 4 has a substantially cuboidal shape, with the dimensions about 2.0 mm in width, about 0.5 mm in height, and about 0.5 mm in depth. In addition, there is no limitation on when to remove the sheet 8 in particular, but it is preferably removed before the light reflecting member 4 is singulated.

Partially Removing the Light Reflecting Member

In the step of partially removing the light reflecting member, the terminal exposure surfaces 4f are formed by partially removing the light reflecting member 4 which has been singulated in the step of providing the light reflecting member. Further, the substantially spherical first terminal 2 and the second terminal 3 are partially exposed from the terminal exposure surfaces 4f, respectively, thus, the exposed portions 2a and 3a are formed. In the first embodiment, the terminal exposure surfaces 4f are each formed by removing a portion around the corner C between the bottom surface 4a, the side surface 4b, and the back surface 4c of the substantially cuboidal light reflecting member 4 shown in FIG. 10B. For example, after the step of providing the light reflecting member, a mask 9 is formed on the light reflecting member 4 except for the portion in which the terminal exposure surface 4f is to be formed (that is, the portion around the corner C between the bottom surface 4a, the side surface 4b, and the back surface 4c). More specifically, in the first embodiment, a substantially T-shaped mask is formed on each of the bottom surface 4a and the back surface 4c to expose the corner C, and a substantially pentagonal mask is formed on the side surface 4b to expose the corner C. Then, a blast treatment is performed so that the first terminal 2 and the second terminal 3 are exposed to a desired extent, whereby the terminal exposure surfaces 4f and the exposed portions 2a and 3a are formed.

It is preferable that at the time of partially removing the light reflecting member 4, the first terminal 2 and the second terminal 3 are not removed. However, the covering portions B (and cores A) of the first terminal 2 and the second terminal 3 may be partially removed together with the part of the light reflecting member 4.

In addition, the light reflecting member 4 may be removed by laser processing. For example, in the laser processing, $CO_2$ laser, excimer laser, or solid-state laser such as YAG laser (fundamental wave, second harmonic wave, triple harmonic wave, or fourfold harmonic wave) can be used. Thus, the light reflecting member 4 can be partially removed with high precision.

As described above, in the step of partially removing the light reflecting member, the exposed portions 2a and 3a, and the terminal exposure surface 4f can be simultaneously formed. Each of the exposed portions 2a and 3a is formed so as to be positioned at an inner side with respect to the outermost surface of the light reflecting member 4 when viewed from the bottom surface 4a side, the side surface 4b side, and the back surface 4c side of the light reflecting member 4, respectively.

Through the steps as described above, there is provided the side-surface light emission type light emitting device 10 in which the exposed portions 2a and 3a each having a round surface are exposed (projected) from the terminal exposure surfaces 4f of the light reflecting member 4 respectively, and are positioned at an inner side with respect to the outermost surface of the light reflecting member 4 when viewed from the bottom surface side, the side surface side, and the back surface side of the light reflecting member 4, respectively.

Figure 14A:
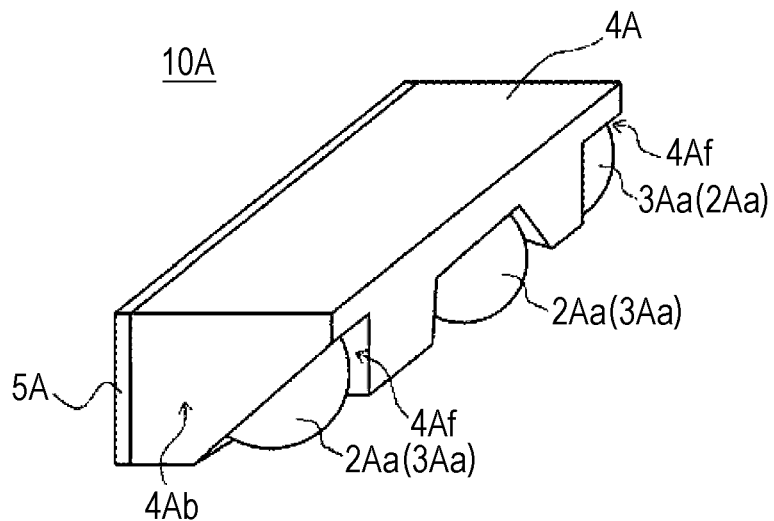
FIG. 14A is a schematic view of a light emitting device according to one embodiment of the present invention.

In addition, according to the first embodiment, the one terminal is connected to one electrode of the light emitting element, but the configuration is not limited to this. For example, as for a light emitting device 10A shown in FIG. 14A, a plurality of first terminals and/or second terminals may be connected to each electrode of the light emitting element. Along with this, a plurality of terminal exposure surfaces 4Af, and exposed portions 2Aa and 3Aa may be provided. In such a case, some of the plurality of terminals may be used as a heat releasing terminal which is not electrically connected to the light emitting element.

Figure 14B:
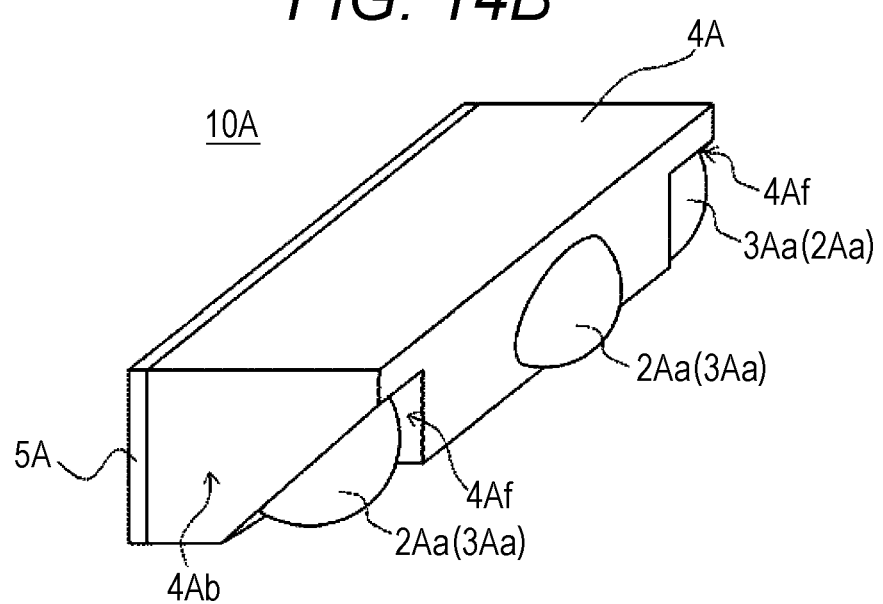
FIG. 14B is a schematic view of a light emitting device according to one embodiment of the present invention.

In addition, as shown in FIG. 14B, a light emitting device may include the exposed portion 2Aa or 3Aa of the first terminal or the second terminal (or the heat releasing terminal) which is provided outside the outermost surface of the light reflecting member 4A when viewed from a bottom surface side, a side surface side, and a back surface side of the light reflecting member 4A.

Figure 15:
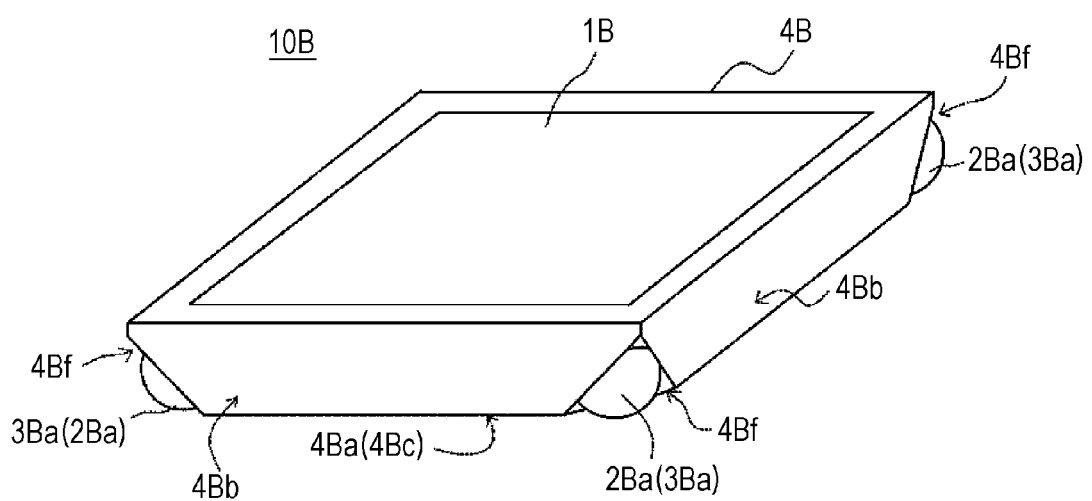
FIG. 15 is a schematic view of a light emitting device according to one embodiment of the present invention.

The side-surface light emission type (side view type) light emitting device 10 has been described in the first embodiment, but the present invention is not limited to this. For example, as shown in FIG. 15, the embodiment of the present invention may be applied to an upper-surface light emission type (top view type) light emitting device 10B in which an upper surface serves as a light emitting surface while a bottom surface serves as a mounting surface. In the case of the upper-surface light emission type (top view type) light emitting device 10B, a back surface 4Bc at an opposite (opposed) side of the light emitting surface is a bottom surface 4Ba, that serves as the mounting surface.

Method for Forming Light Emitting Module 100

The light emitting module 100 is formed by mounting the light emitting device 10 formed through the steps as described above on the previously prepared mounting substrate 20. Hereinafter, a method for forming the light emitting module 100 will be described. The description below is one example, and a desired method and a desired step order may be appropriately used.

First, a bonding agent 6 is applied on the wirings 21 of the mounting substrate 20. For example, a solder which is a bonding agent 6 can be applied by using a screen printing method using a metal mask. It is preferable that the solder melts at a temperature lower than the temperature at which the solder that connects the light emitting element 1 and the first terminal and the second terminal melts. As for the bonding agent 6, an Ag paste may be used. Subsequently, the light emitting device 10 is set on the bonding agent 6. In this state, the bonding agent 6 is melted and cured, thus, the light emitting device 10 is electrically connected to the mounting substrate 20, and the light emitting module 100 is obtained. In addition, as described above, in the case where each of the first terminal 2 and the second terminal 3 is composed of the spherical Cu core A covered with the covering portion B made of Sn, the light emitting device 10 can be connected to the mounting substrate 20 without using the bonding agent 6. That is, the exposed portions 2a and 3a of the light emitting device 10 are placed on the wiring 21 of the mounting substrate 20 and heated, thus, eutectic bonding can be provided between the light emitting device 10 and the mounting substrate 20, with Sn of the covering portion B formed on the surfaces of the exposed portions 2a and 3a.

Second Embodiment

Light Emitting Device 50

Figure 12:
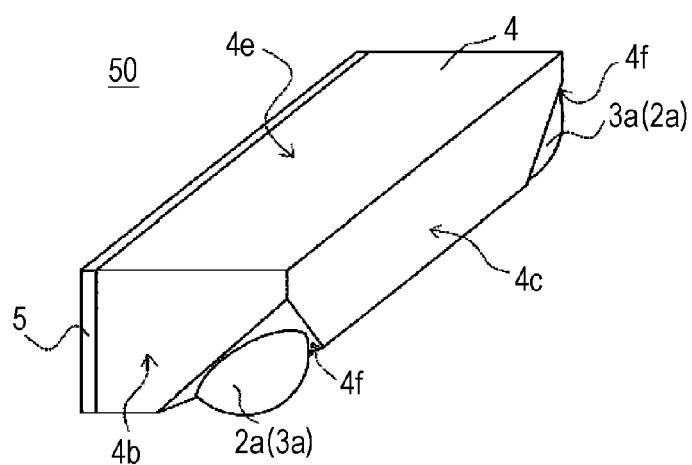
FIG. 12 is a schematic perspective view of a light emitting device 50 according to a second embodiment viewed from a back surface side.

FIG. 12 is a schematic perspective view of the light emitting device 50 according to a second embodiment, viewed from a back surface side. The light emitting device 50 differs from the light emitting device 10 of the first embodiment, in the shape of the terminal exposure surfaces 4f. The terminal exposure surfaces 4f of the light emitting device 50 each has a substantially flat surface, and a light reflecting member 4 is provided thicker in the depth direction than that of the light emitting device 10 of the first embodiment. Other than that, the light emitting device 50 is configured substantially similar to the light emitting device 10 of the first embodiment, so that its description may be omitted appropriately.

The substantially flat terminal exposure surfaces 4f according to the second embodiment can be formed, for example, in the step of providing the light reflecting member by forming a mask having a shape different from that of the first embodiment, on the substantially cuboidal light reflecting member 4 before forming the terminal exposure surfaces 4f. More specifically, according to the second embodiment, a hexagonal mask is formed on each of the bottom surface 4a and a back surface 4c, and a pentagonal mask is formed on a side surfaces 4b of the light reflecting member 4 to expose a corner C. After that, a blast treatment is performed, whereby the substantially flat terminal exposure surface 4f can be formed.

With such flat terminal exposure surfaces 4f, similar to the light emitting device 10 in the first embodiment, the light emitting device 50 of small in size, high in connection strength and mounting applicability with respect to the mounting substrate, and great in light extraction efficiency can be obtained. Furthermore, the light reflecting member 4 becomes possible to have a relatively large thickness in the depth direction, so that the light of the light emitting element 1 can be prevented from leaking from the light reflecting member 4. Furthermore, a light emitting module equipped with the light emitting device 50 mounted on a mounting substrate can exhibit similar effects as described above.

Some embodiments have been illustrated in the above, but the present invention is not limited to the above embodiments, and can be modified within the scope of the present invention as a matter of course.

A light emitting device according to an embodiment includes:

a light emitting element;

a first terminal and a second terminal each having a substantially spherical shape and being electrically connected to the light emitting element; and a light reflecting member for holding the light emitting element, the first terminal, and the second terminal, in which the light reflecting member includes a bottom surface serving as a mounting surface, a side surface adjacent to the bottom surface, a back surface opposite to a light emitting surface of the light emitting element, and a terminal exposure surface for exposing the first terminal and the second terminal as exposed portions, and the exposed portions are provided inside outermost surfaces of the light reflecting member when viewed from a bottom surface side, a side surface side, and a back surface side of the light reflecting member.

In addition, a method for manufacturing a light emitting device according to an embodiment includes:

a first step of connecting substantially spherical first terminal and second terminal to a light emitting element;

a second step of forming a light reflecting member to hold the light emitting element, the first terminal, and the second terminal; and a third step of forming a terminal exposure surface by partially removing the light reflecting member, to partially expose the first terminal and the second terminal from the terminal exposure surface, in which in the second step, the light reflecting member is formed into a shape having a bottom surface serving as a mounting surface, a side surface adjacent to the bottom surface, and a back surface opposite to a light emitting surface of the light emitting element, and in the third step, the light reflecting member is partially removed so that exposed portions of the first terminal and the second terminal are positioned inside outermost surfaces of the light reflecting member when viewed from a bottom surface side, a side surface side, and a back surface side of the light reflecting member.

According to the light emitting device in the embodiments, the light emitting device can be small in size and great in mountability. In addition, according to the method for manufacturing a light emitting device in the embodiment, the light emitting device which is small in size and great in mountability can be manufactured with no difficulty.

Obviously, numerous modifications and variations of the present invention are possible in light of the above teachings. It is therefore to be understood that within the scope of the appended claims, the invention may be practiced otherwise than as specifically described herein.

What is claimed is:

1. A light emitting device comprising:

a light emitting element having a light emitting surface to emit a light;

a first terminal and a second terminal each having a substantially spherical shape and being electrically connected to the light emitting element; and
a light reflecting member holding the light emitting element, the first terminal, and the second terminal, the light reflecting member comprising:
a bottom surface via which the light emitting device is to be placed;
an upper surface opposite to the bottom surface in a height direction of the light emitting device;
a first side surface provided between the bottom surface and the upper surface on a first side in a width direction of the light emitting device perpendicular to the height direction;
a second side surface provided between the bottom surface and the upper surface on a second side opposite to the first side in the width direction;
a front surface provided between the bottom surface and the upper surface and between the first side surface and the second side surface on a front side in a depth direction of the light emitting device perpendicular to the height direction and the width direction, the light emitting surface of the light emitting element being exposed from the front surface;
a back surface provided between the bottom surface and the upper surface and between the first side surface and the second side surface on a back side opposite to the front side in the depth direction;
a first terminal exposure surface from which the first terminal is exposed to provide a first exposed portion; and
a second terminal exposure surface from which the second terminal is exposed to provide a second exposed portion, the first and the second exposed portions being provided inside a bottom region defined by the first side surface, the second side surface, the front surface, and the back surface of the light reflecting member when viewed from a bottom surface side of the light reflecting member in the height direction, being provided inside a side region defined by the upper surface, the bottom surface, the front surface, and the back surface of the light reflecting member when viewed from the first side or the second side of the light reflecting member in the width direction, and being provided inside a back region defined by the first side surface, the second side surface, the upper surface, and the bottom surface of the light reflecting member when viewed from the back side of the light reflecting member in the depth direction.

2. The light emitting device according to claim 1, wherein the first terminal exposure surface and the second terminal exposure surface are respectively connected to the bottom surface, the side surfaces, and the back surface of the light reflecting member.

3. The light emitting device according to claim 1, wherein each of the first terminal and the second terminal has a core and a covering portion covering the core, and wherein a melting temperature of the core is higher than a melting temperature of the covering portion.

4. The light emitting device according to claim 3, wherein the core contains Cu, and wherein the covering portion is made of an alloy containing Au and at least one of Si, Ge, and Sn.

5. The light emitting device according to claim 3, wherein the light emitting element and the core are connected by eutectic bonding.

6. The light emitting device according to claim 1, further comprising:
a wavelength conversion layer covering the light emitting surface of the light emitting element.

7. A light emitting module comprising:
the light emitting device according to claim 1 mounted on a mounting substrate.

8. A method for manufacturing a light emitting device, the method comprising:
connecting a first terminal and a second terminal to a light emitting element having a light emitting surface to emit a light, the first terminal and the second terminal each having a substantially spherical shape;
providing a light reflecting member to hold the light emitting element, the first terminal, and the second terminal and to include
a bottom surface via which the light emitting device is to be placed,
an upper surface opposite to the bottom surface in a height direction of the light emitting device,
a first side surface provided between the bottom surface and the upper surface on a first side in a width direction of the light emitting device perpendicular to the height direction,
a second side surface provided between the bottom surface and the upper surface on a second side opposite to the first side in the width direction,
a front surface from which the light emitting surface of the light emitting element is exposed and which is provided between the bottom surface and the upper surface and between the first side surface and the second side surface on a front side in a depth direction of the light emitting device perpendicular to the height direction and the width direction, and
a back surface provided between the bottom surface and the upper surface and between the first side surface and the second side surface on a back side opposite to the front side in the depth direction; and
removing the light reflecting member partially so that a first terminal exposure surface is provided and the first terminal is partially exposed from the first terminal exposure surface to provide a first exposed portion, so that a second terminal exposure surface is provided and the second terminal is partially exposed from the second terminal exposure surface to provide a second exposed portion, and so that the first and the second exposed portions are provided inside a bottom region defined by the first side surface, the second side surface, the front surface, and the back surface of the light reflecting member when viewed from a bottom surface side of the light reflecting member in the height direction, are provided inside a side region defined by the upper surface, the bottom surface, the front surface, and the back surface of the light reflecting member when viewed from the first side or the second side of the light reflecting member in the width direction, and are provided inside a back region defined by the first side surface, the second side surface, the upper surface, and the bottom surface of the light reflecting member when viewed from the back side of the light reflecting member in the depth direction.

9. The method according to claim 8,
wherein in the removing of the light reflecting member, the light reflecting member is partially removed by a blast treatment.

* * * * *